(12) United States Patent
Root (10) Patent No.: US 6,201,402 B1
(45) Date of Patent: *Mar. 13, 2001

(54) PROBE TILE AND PLATFORM FOR LARGE AREA WAFER PROBING

(75) Inventor: Bryan J. Root, Apple Valley, MN (US)

(73) Assignee: Celadon Systems, Inc., Apple Valley, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/021,631

(22) Filed: Feb. 10, 1998

Related U.S. Application Data (60) Provisional application No. 60/042,812, filed on Apr. 8, 1997.

(51) Int. Cl.[7] ................................................. G01R 31/02
(52) U.S. Cl. ........................................ 324/754; 324/158.1
(58) Field of Search ................................ 324/72.5, 754, 324/761, 762, 158.1, 73.1; 439/482

(56) References Cited

U.S. PATENT DOCUMENTS

| | | |
|---|---|---|
| 3,787,768 * | 1/1974 | Kubota et al. ........................ 324/754 |
| 4,667,523 | 5/1987 | Becker et al. . |
| 5,003,254 * | 3/1991 | Hunt et al. .............................. 324/754 |
| 5,150,040 | 9/1992 | Byrnes et al. . |
| 5,168,218 | 12/1992 | Rich . |
| 5,192,907 | 3/1993 | Bonaria . |
| 5,325,052 * | 6/1994 | Yamashita ............................. 324/754 |
| 5,473,254 * | 12/1995 | Assar ................................... 324/754 |
| 5,488,292 * | 1/1996 | Tsuta .................................... 324/754 |

* cited by examiner

*Primary Examiner*—Vinh P. Nguyen
(74) *Attorney, Agent, or Firm*—Blakely, Sokoloff, Taylor & Zafman (57) ABSTRACT

A system and method for a plurality of probe tiles and a probe platform for electrically probing a semiconductor wafer over a broad area of the semiconductor wafer. Nine ceramic tiles are configured in a flat three by three matrix, and are held in place by a probing platform. Each tile may be moved independently in an X and Y direction. The probe platform has three control knobs on the side to move a tile in the X direction and three control knobs on the front to move a tile in the Y direction. The control knobs are attached to transmission shafts which slide back and forth into three ball detent positions. The ball detent positions determine which tile is engaged and can be manipulated. The ceramic tiles hold self-aligning tungsten probe tips to permit semiconductor wafer testing over a wide temperature range.

10 Claims, 12 Drawing Sheets

PROBE TILE AND PLATFORM FOR LARGE AREA WAFER PROBING

This application claim benefit to Provisional application No. 60/042,812 filing date Apr. 8, 1997.

FIELD OF THE INVENTION

This invention relates generally to semiconductor test equipment, and more particularly, b, a system and method for a plurality of probe titles and a probe platform for electrically probing a semiconductor wafer over a broad area of the semiconductor wafer.

BACKGROUND OF THE INVENTION

The semiconductor industry has a need to access many electronic devices on a semiconductor wafer. As the semiconductor industry grows and devices become more complex, engineers and scientists require tools to access devices quickly and easily on a semiconductor wafer. Many wafer tests take hours, days, or weeks to perform, and would more efficiently be performed in parallel. Probe cards have been developed to probe long rows or areas of the wafer. However, these developments are still geared to a short term electrical tests and a limited temperature range.

Semiconductor wafer probing is typically performed with probe cards built using FR-4, polyamide or a similar material. Such cards typically use an epoxy ring to hold tungsten probes in place. These types of probe cards are generally designed for probing one device at a time on the wafer in a narrow temperature range. The larger vendors of these types of probe cards are Cerprobe, Probe Technology, MJC Japan, and others. Probers, built by companies such as Electraglass and TEL, step the probe card across the wafer so the devices on the wafer can be electrically probed.

Ceramic versions of a typical probe card have been developed, however these are limited to, and designed for, probing a single device. Other ceramic probe cards have been designed for probing a confined area of a wafer at a narrow temperature range. These probe cards can be permanently damaged and broken if driven into the wafer.

No method is currently known to probe multiple locations over a broad area on a semiconductor wafer. The need to access several locations on a semiconductor wafer will increase as design rules shrink device features, the speed of devices increases, and device shipments continue to grow at high rates. Therefore, there is a need for a way to probe multiple locations on a semiconductor wafer. Further, there is a need for a robust probe card which may probe a wafer at a wide temperature range without breaking.

SUMMARY OF THE INVENTION

The present invention provides a system and method for a plurality of probe titles and a probe platform for electrically probing a semiconductor wafer over a broad area of the semiconductor wafer. Nine ceramic tiles are configured in a flat three by three matrix, and are held in place by a probing platform. Each tile may be moved independently in an X and Y direction. The probe platform has three control knobs on the side to move a tile in the X direction and three control knobs on the front to move a tile in the Y direction. The control knobs are attached to transmission shafts which slide back and forth into three ball detent positions. The ball detent positions determine which tile is engaged and can be manipulated. The ceramic tiles hold self-aligning tungsten probe tips to permit semiconductor wafer testing over a wide temperature range.

BRIEF DESCRIPTION OF THE DRAWINGS

The present invention is illustrated by way of example by the accompanying drawings, in which like references indicate similar elements and in which.

DETAILED DESCRIPTION OF A PREFERRED EMBODIMENT OF THE PRESENT INVENTION

In the following description of a preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

For purposes of explanation, numerous specific details are set forth in the following description in order to provide a thorough understanding of the present invention. However, it will be evident to one of ordinary skill in the art that the present invention may be practiced without some of these specific details. In other instances, well-known structures and devices are shown in block diagram form in order to facilitate description.

The present invention significantly decreases the amount of time required to probe multiple dies on a semiconductor wafer. The present invention is useful in assisting the determination of semiconductor reliability, and assisting device manufacturers with device development, research and development, process development, yield enhancement, device failure analysis and device testing.

Figure 1A:
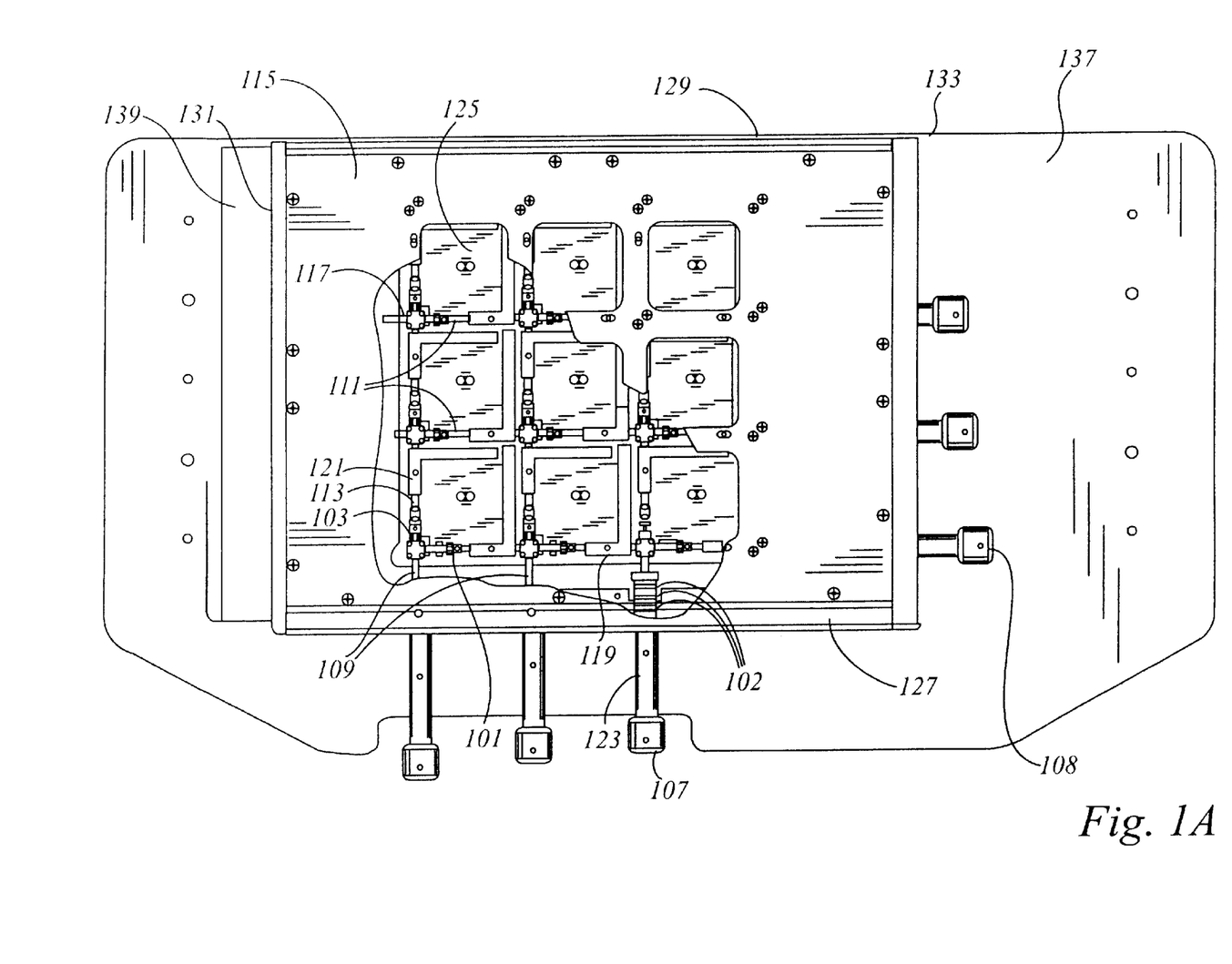
FIGS. 1A, 1B, 1C show a top, front, and side view of a probe tile and probe platform compatible with the present invention.

The present invention provides a probe tile and probe platform for electrically probing many semiconductor wafer bond pads over a broad area of the semiconductor wafer. Nine ceramic tiles are configured in a flat three by three matrix, and are held in place by a probing platform. The tiles preferably have the dimensions of 1.8 inches (45.7 mm) long, by 1.8 inches (45.7 mm) wide, by 0.125 inches (3.2 mm) high, but it will be recognized by one of ordinary skill in the art that other tile dimensions, for example four inch tiles or six inch tiles, may be used without loss of generality. Each tile may be moved independently in an X and Y direction. FIG. 1A illustrated one embodiment of the probe platform having three side control knobs 108 to move a tile in the X direction and three front control knobs 107 to move a tile in the Y direction. The front control knobs 107 are attached to front transmission shafts 109, and the side control knobs 108 are attached to side transmission shafts 111. The front and side transmission shafts 109 and 111 slide back and forth into three ball detent positions 102. The ball detent positions 102 determine which tile is engaged and can be manipulated. The front and side control knobs 107 and 108 and ball detent positions 102 are preferably operated by hand, but may also be attached to a motor or other movement mechanism for automatic positioning and selecting of the semiconductor wafers and dies during testing. It will be recognized by one of ordinary skill in the art that the number of ceramic, tiles, control knobs, and transmission shafts may be increased or decreased without loss of generality. For example, the present invention could be, configured with sixteen tiles having four control knobs and transmission shafts on the side of the platform and four control knobs and transmission shafts on the front of the platform.

Figure 1B:
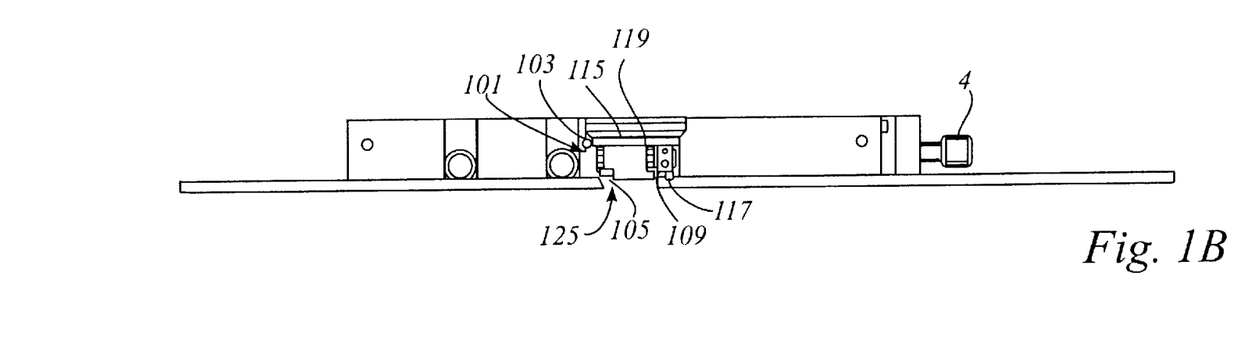
Figure 1C:
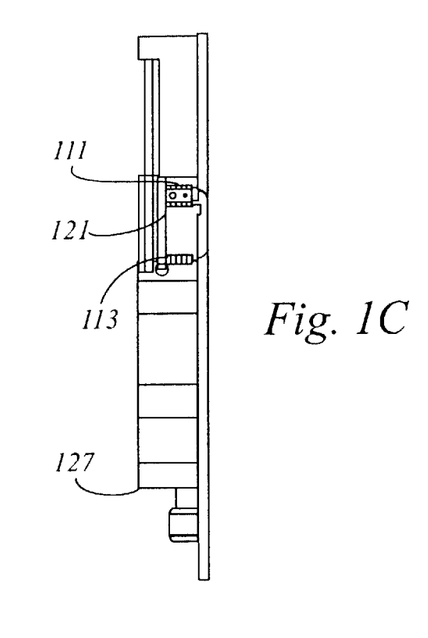

A preferred embodiment of the present invention is shown in FIGS. 1A, 1B, and 1C. A round front control knob 107 is connected to a front transmission shaft 109, and a round side control knob 108 is connected to a side transmission shaft 111. The front control knob 107 or the side control knob 108 permits the user to transmit rotational power to a transmission shaft. There are three side control knobs 108 and three side transmission shafts 111 on the right side of the probing platform, and there are three front control knobs 107 and three front transmission shafts 109 on the front of the probing platform.

A front transmission shaft 109 or a side transmission shaft 111 is connected to three gears 101. The front transmission shaft 109 or the side transmission shaft 111 transmits rotational power to the connected gears 101. Each round front control knob 107 and front transmission shaft 109 or each round side control knob 108 and side transmission shaft 111 is connected to a round detent strike 123. The detent strike 123, together with a ball plunger 135, permits the user to engage only one gear at a time by sliding it back and forth in three detent positions 102. A gear 101 is connected to a front transmission shaft 109 or a side transmission shaft 111. The gear transmits rotational input from the front transmission shaft 109 or the side transmission shaft 111 to a stub shaft gear 103.

The stub shaft gear 103 is connected to a stub shaft 113. The stub shaft gear 103 transmits rotational input from the gears to the stub shaft 113. As the stub shaft 113 rotates threads move the X-transfer block 119 back and forth in the X direction, or the Y-transfer block 121 back and forth in the Y direction.

The stub shaft 113 and the front transmission shaft 109 or the side transmission shaft 111 are held in place by a square bearing 117. There are preferably sixteen square bearings 117, one located at each corner of the three by three matrix.

Figure 1D:
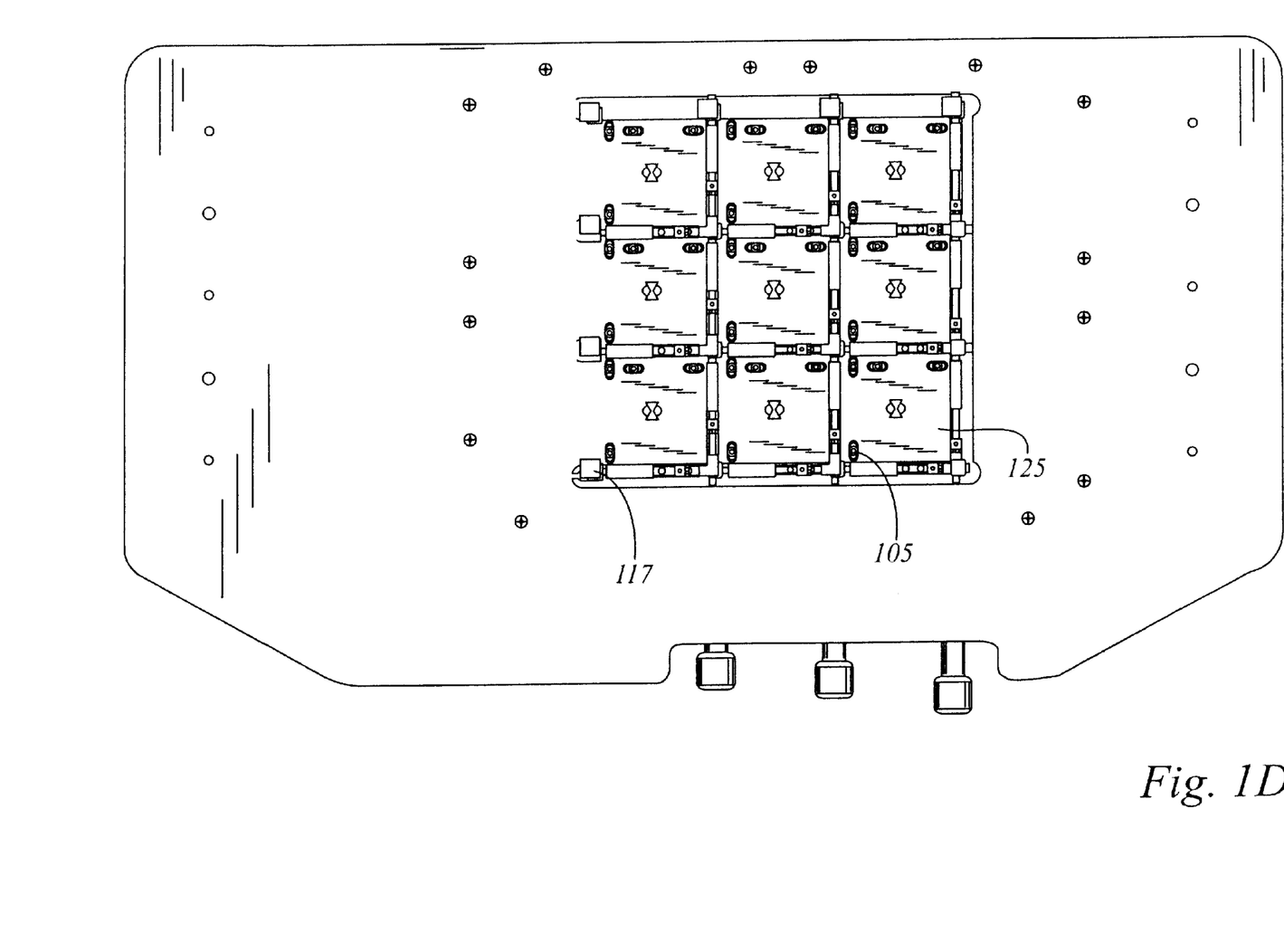

A ceramic tile 125 is fastened to the X-transfer block 119, and the Y-transfer block 121, by a round tile bushing 105, and a flat head screw. There are preferably three bushings 105, and three screws used on each tile 125. FIG. 1D illustrates an exemplary bottom view of the platform, showing the square bearings 117, the bushing 105, and the tile 125. The square bearings 117 are preferably held in place by a mounting plate 115. The mounting plate 115 is held in place by front standoff 127, back standoff 129, left standoff 131, and right standoff 133. The standoffs attach to a base plate 137.

A removable clear glass plate 139 is present on the platform. Not shown is a removable opaque cover, roughly conforming to the shape of the mounting plate 115, that may be placed over the glass plate 139 during light sensitive experiments. Also not shown are vacuum couplings, attached to base plate 137, which provide a vacuum to retain the base plate 137 to a probe station.

The base plate 137, as well as certain other portions of the platform, are preferably constructed from stainless steel throughout to permit testing in high temperatures and to provide a thermal coefficient of expansion equal in all parts of the platform.

Figures 2A, 2B:
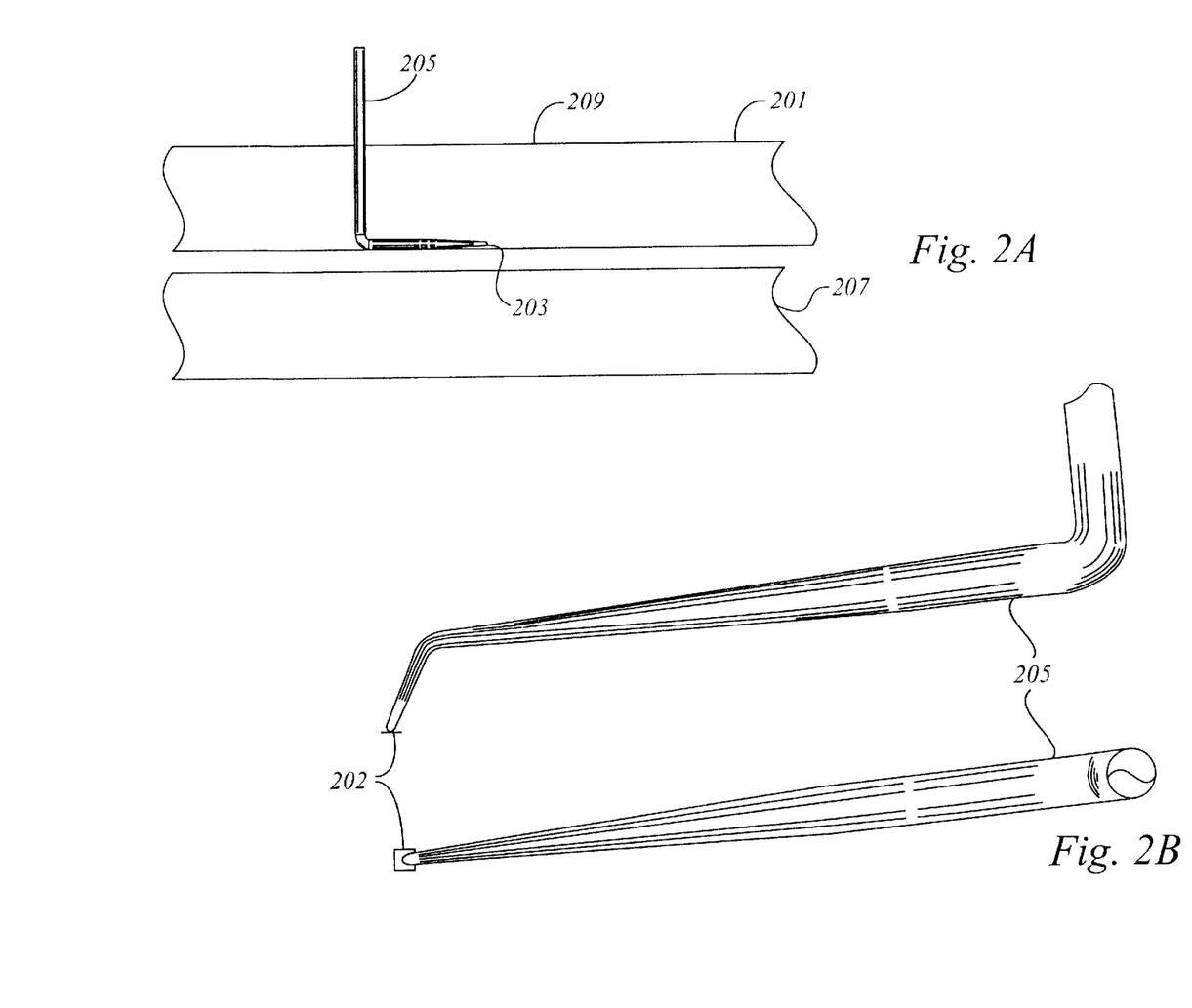
FIG. 2 shows, a ceramic tile, probe wire, and semiconductor wafer detail compatible with the present invention.
Figure 3:
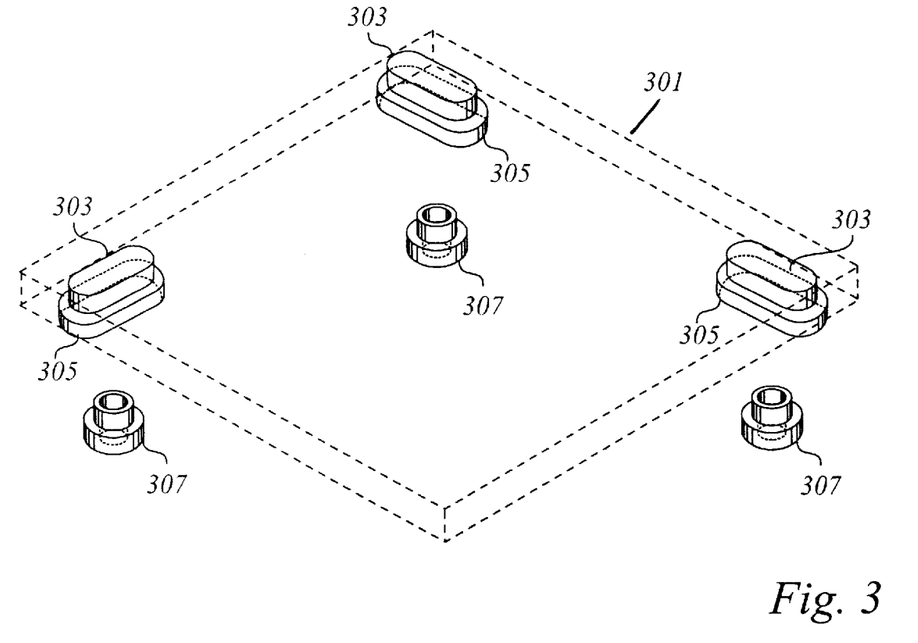
FIG. 3 shows, an exploded view of a ceramic tile with tile bushings compatible with the present invention.

As shown in FIG. 2, a ceramic tile 201 holds electrochemically etched tungsten probe tips, 203 to permit semiconductor wafer testing over a wide temperature range. The probes 205 are self-aligning and preferably have a high density of 0.020 inch linear pitch. As shown in FIG. 2, the probes configured to fit the tile pattern of the probe platform. The tungsten probes 205 are preferably set into drilled holes in each ceramic tile with high temperature ceramic epoxy, but it will be recognized by one of ordinary skill in the art that the probes may be attached in other ways and by other means without loss of generality. It will also be recognized that while the probes 205 may be made of tungsten, they may also be made of electrically conductive material, such as beryllium copper (BeCu), which does not substantially deform and remains electrically conductive over a wide range of temperatures. FIG. 2B illustrates an exemplary drawing of the probe 205 and the bond pad 202. As shown in FIG. 3, a ceramic tile 301 includes special mounting holes 303 and guides 305 to allow their connection to the probe platform. Bushings 307, are used to attach the tile to the probe platform.

Figure 4A:
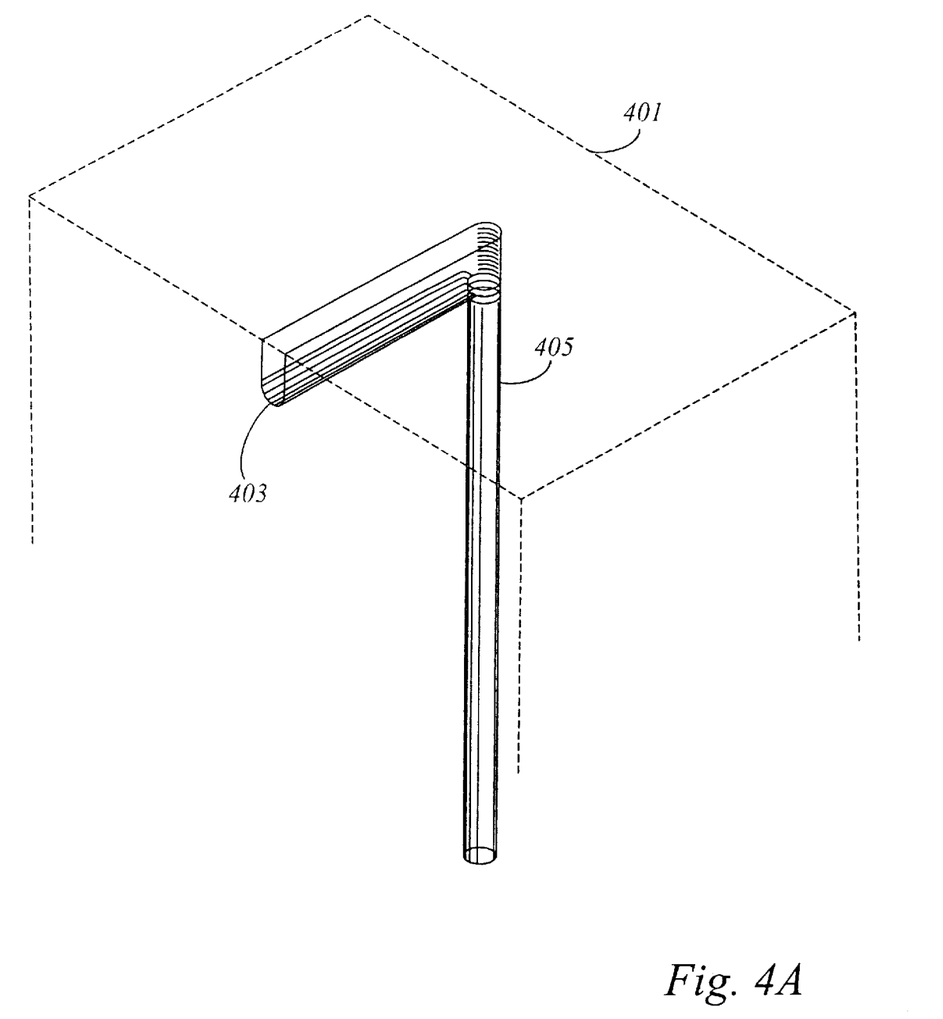
FIG. 4 shows a milled self-aligning hole compatible with the present invention.
Figure 4B:
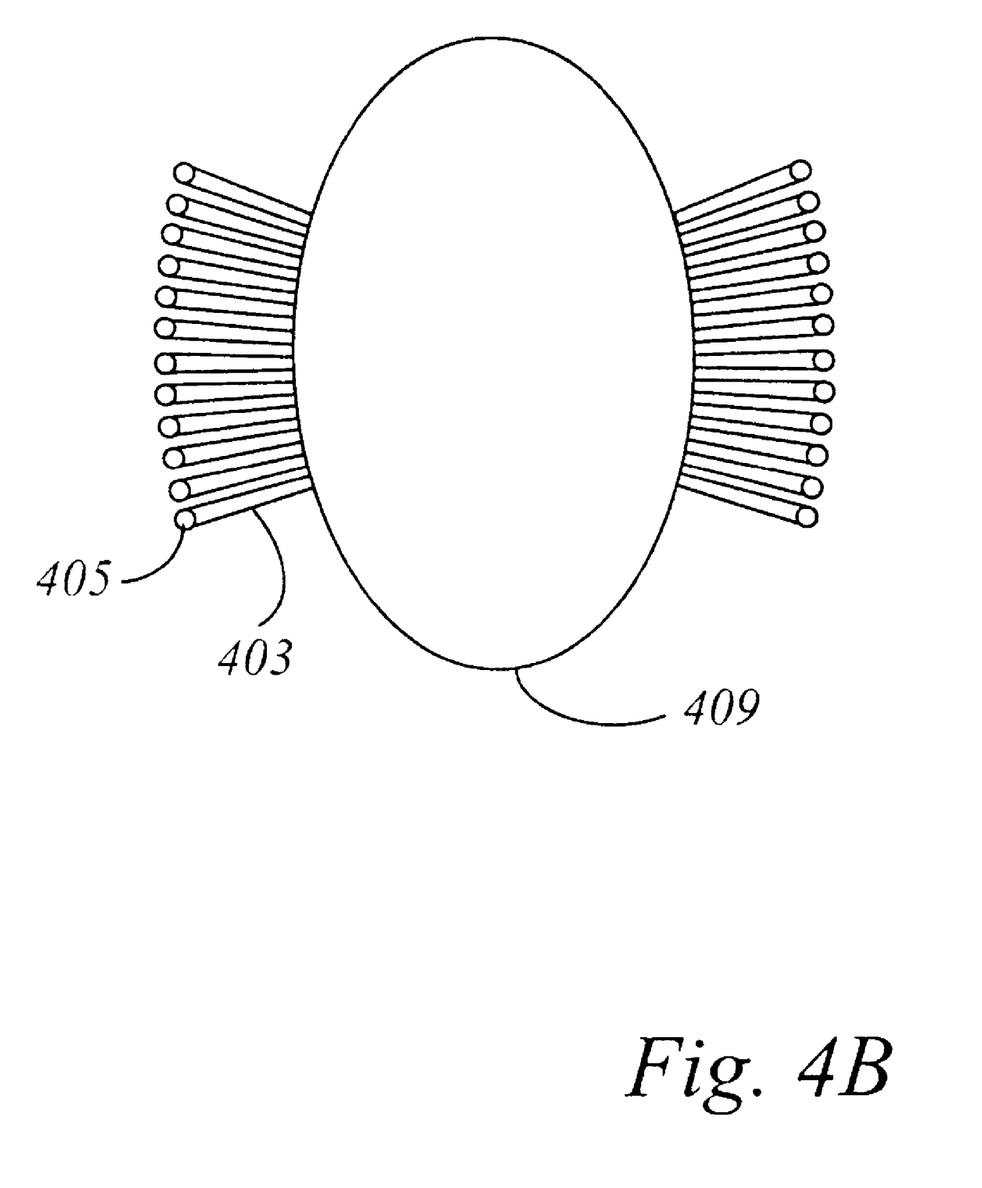
Figure 4C:
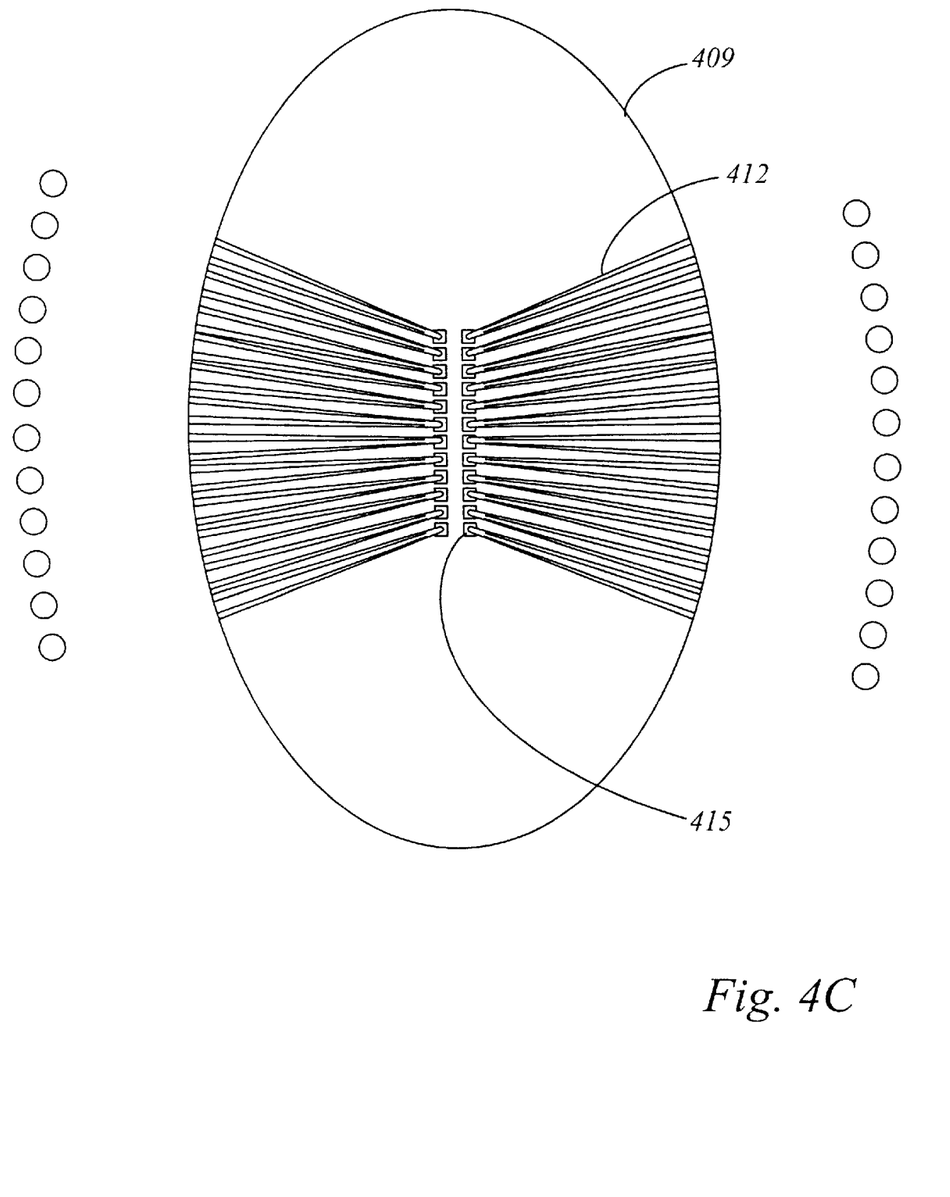

As shown in FIG. 4, the tungsten probes are typically placed in precision machined guides 403 and drill holes 405 in the ceramic tile 401 to self align the probes with bond pads on the semiconductor wafer. FIG. 4B illustrates an exemplary drawing of a plurality of drill holes 405, machined guides 403, and view hole 409. The number of probes on a semiconductor wafer is primarily dependent upon the semiconductor water type and the number of electrical contacts. There may be as little as one probe, or else there may be many probes per semiconductor wafer. Drilled holes 405 and machined guides 403 in the ceramic tiles 401 are provided to accommodate the tungsten probes. Referring back to FIG. 2, the semiconductor wafer 207 rests on a semiconductor wafer chuck below the ceramic tile 201 which enables the tungsten probes 205 to then make electrical contact with the bond pad of the semiconductor wafer 207.

View holes 209 may optionally be created through some or all of the ceramic tiles to permit viewing of the semiconductor wafer 207 if required by certain applications. The low profile of the ceramic tiles 201 enables a dry nitrogen environment near the semiconductor wafer 207, and the optionally present view holes 209 enable the ability to view a device under test (DUT) without breaking the nitrogen environment. To maintain a dry nitrogen environment, a clear glass plate is placed in the platform, forming a seal with the platform. The seal may be a loose seal if a positive pressure nitrogen environment is maintained. Alternatively, the seal may be gas-tight if a non-positive pressure nitrogen environment is used.

Figure 5:
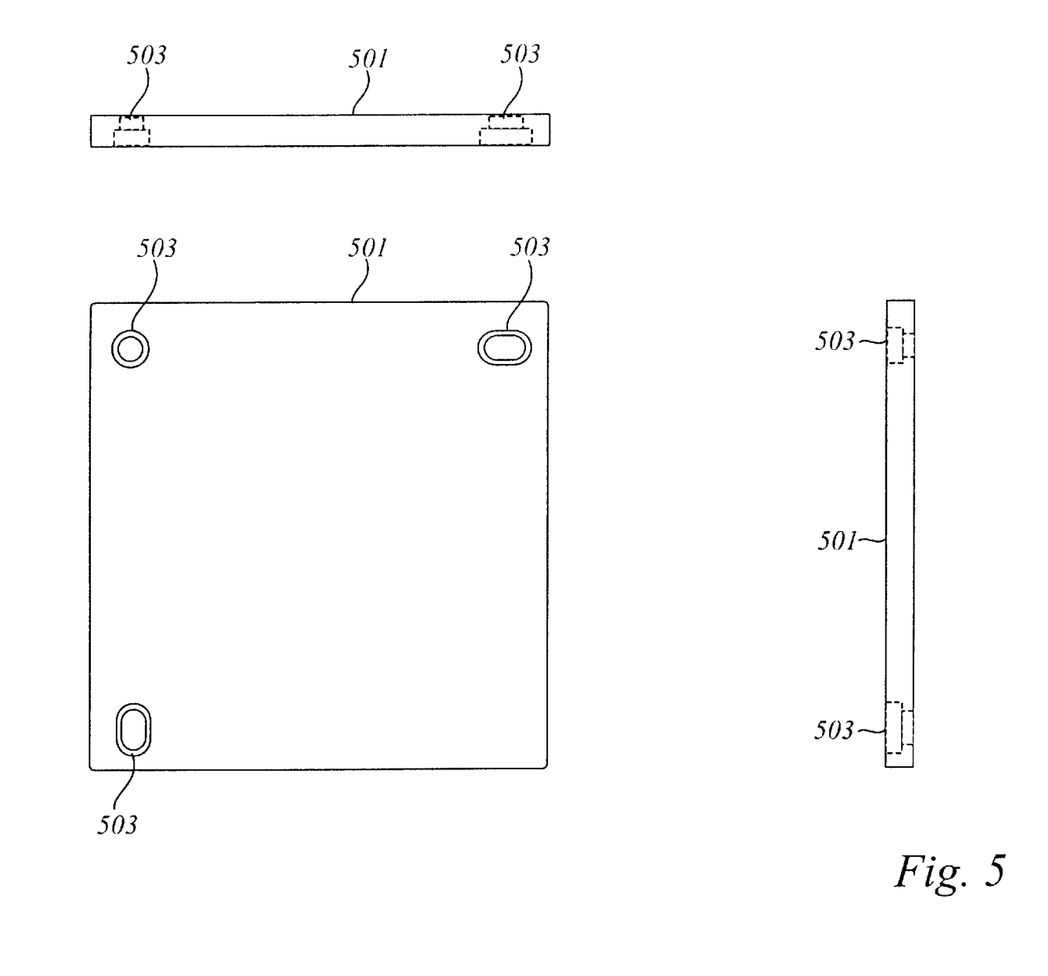
FIG. 5 shows a small square ceramic tile compatible with the present invention.
Figure 6:
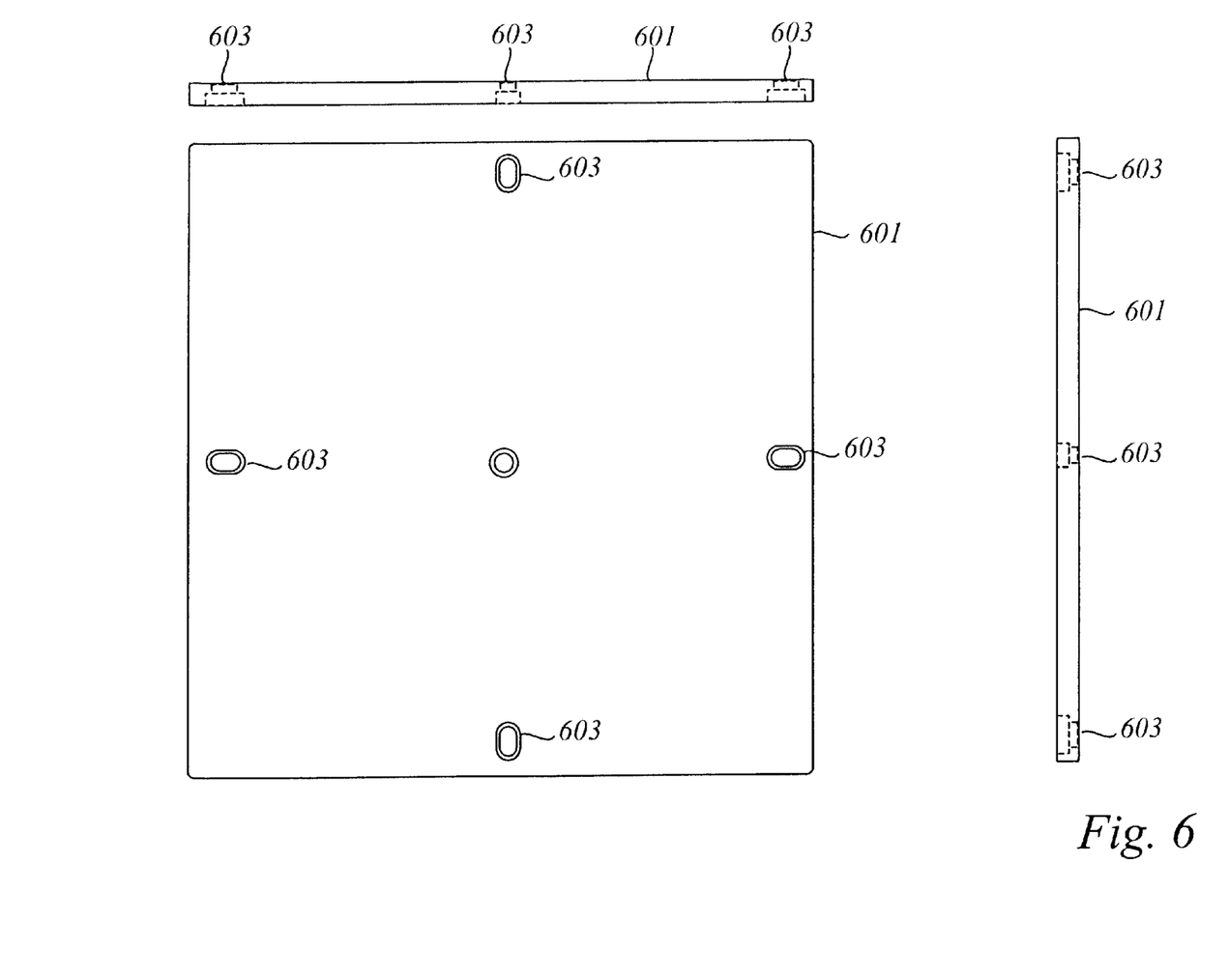
FIG. 6 shows a square ceramic tile compatible with the present invention.
Figure 7:
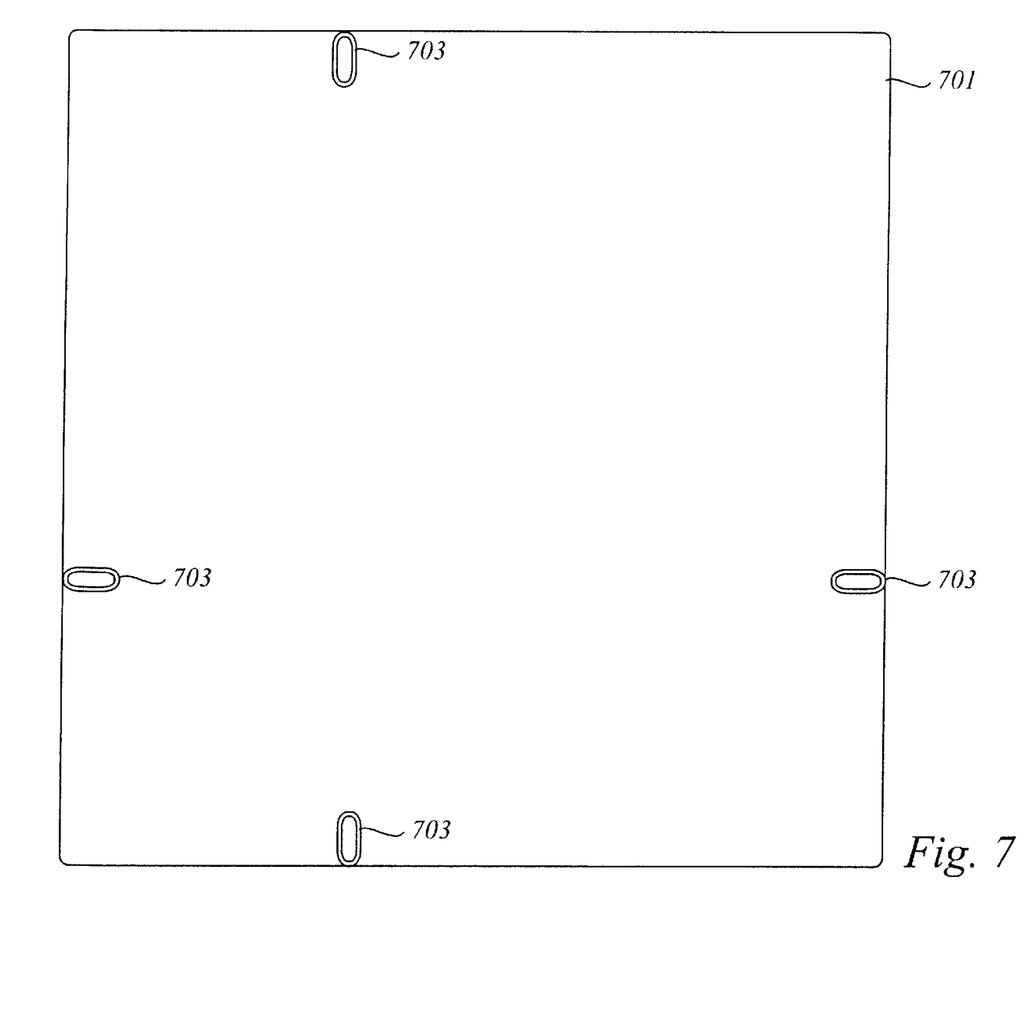
FIG. 7 shows a large square ceramic tile compatible with the present invention.
Figure 8:
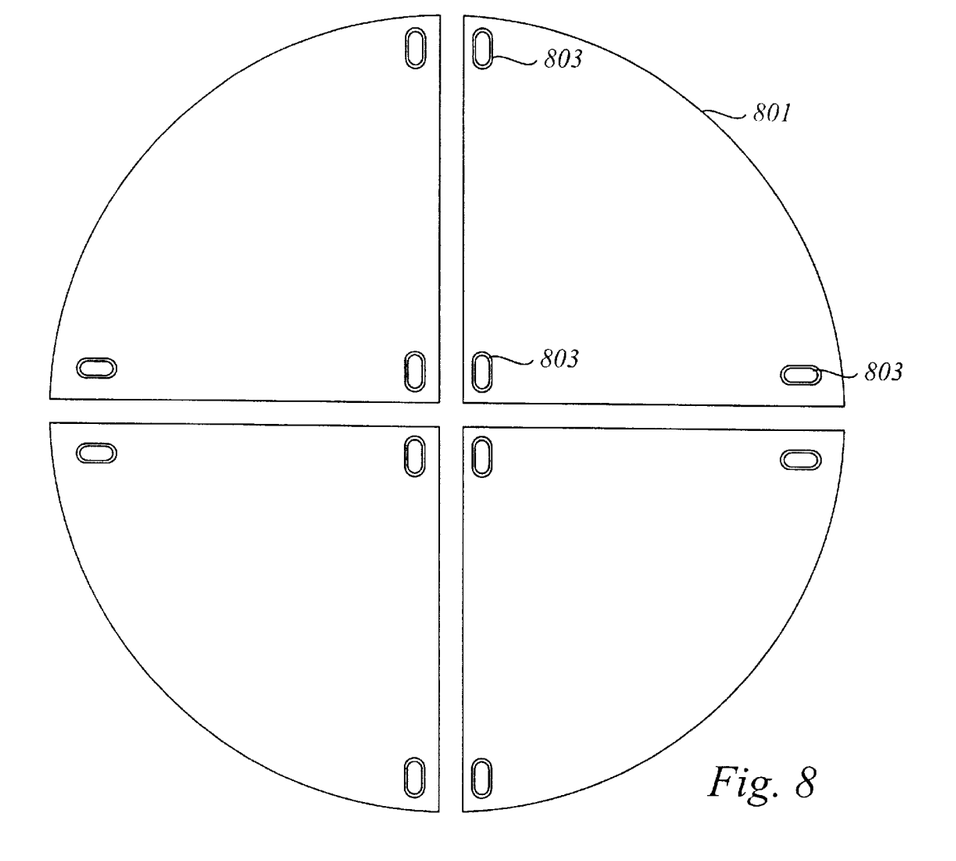
FIG. 8 shows pie shaped ceramic tiles compatible with the present invention.

Alternative embodiments of ceramic tiles which may be used with the present invention are shown in FIGS. 5, 6, 7, and 8. As shown in FIG. 5, a preferred embodiment of the tile may be a 62 mm×62 mm square tile 501 having three retainer slots 503, one each of the retainer slots 503 being located in three of the four corners of the tile. As shown in FIG. 6, an alternative embodiment of the file may be a 110 mm×110 mm square tile 601 having four retainer slots 603, one each of the retainer slots 603 being located along each edge of the tile and substantially centered along each side. As shown in FIG. 7, an alternative embodiment of the tile may be a 160 mm×160 mm square tile 701 having four retainer slots 703, one each of the retainer slots 703 being located along each edge of the tile and substantially off-centered along each side. As shown in FIG. 8, another alternative embodiment of the tile may be pie shaped tiles 801 with a combined radius of 200 mm square, each tile having three retainer slots 803, one each of the retainer slots 803 being located in each of the three corners of a tile 801. It will be recognized by one of ordinary skill in the art that the dimensions of a tile, and the number and placement of retainer slots on a tile, may vary from the embodiments described above without loss of generality.

Figure 9:
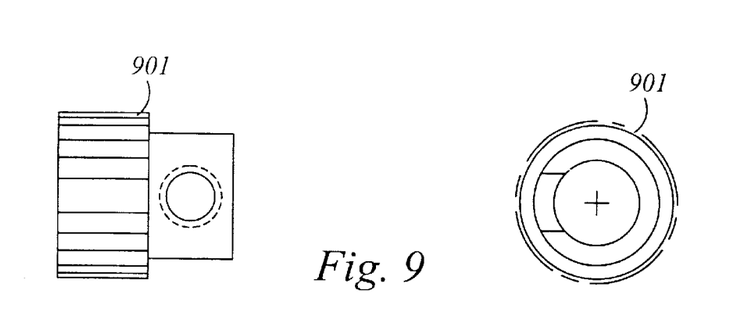
FIG. 9 shows a gear wheel compatible with the present invention.

A preferred gear wheel 901 is shown in FIG. 9, showing a side view and a front view. A gear wheel 901 is attached to the front transmission shafts 109 and to the side transmission shafts 111, as shown by gears 101 in FIG. 1. The gear wheels engage each other and transmit rotational power from a front transmission shaft 109 or a side transmission shaft 111 to move a probe tile in the direction of either the X direction or Y direction.

While the invention is described in terms of preferred embodiments in a specific system environment, those of ordinary skill in the art will recognize that the invention can be practiced, with modification, in other and different hardware and software environments.

What is claimed is:

1. A probe platform for electrically probing semiconductor wafers comprising:

a plurality of tiles attached to a platform and configured in a matrix having an X-axis and an orthogonal Y-axis, wherein each of the tiles may move independently parallel to the X-axis and the Y-axis, each tile attached to a plurality of probes to permit semiconductor wafer testing;

a plurality of first transmission shafts attached to the plurality of tiles parallel to the X-axis, each of the first transmission shafts having a first control knob for imparting rotational power to the first transmission shaft, each of the first transmission shafts capable of sliding parallel to the X-axis into a plurality of ball detent positions, wherein each of the ball detent positions determines which tile is engaged and can be manipulated parallel to the X-axis; and a plurality of second transmission shafts attached to the plurality of tiles parallel to the Y-axis, each of the second transmission shafts having a second control knob for imparting rotational power to the second transmission shaft, each of the second transmission shafts capable of sliding parallel to the Y-axis into a plurality of ball detent positions, wherein each of the ball detent positions determines which tile is engaged and can be manipulated parallel to the Y-axis.

2. The platform of claim 1 wherein the first control knob is a side control knob, wherein the first transmission shaft is the side transmission shaft, wherein the second control knob is a front control knob, and wherein the second transmission shaft is the front transmission shaft.

3. The platform of claim 1 further comprising:

a plurality of gears attached to each of the plurality of second transmission shafts and the plurality of first transmission shafts;

a plurality of stub shaft gears attached to each of the plurality of gears; and a plurality of stub shafts attached to each of the plurality of stub shaft gears and each of the plurality of tiles, each stub shaft gear transmitting rotational input from the gears to the respective stub shaft.

4. The platform of claim 1 wherein the probes are electrically conductive probes, and wherein the probes attached to the tiles through holes and slots on the tiles.

5. The platform of claim 1 wherein the tile has a view hole to view the electrically conductive probe.

6. The platform of claim 1 wherein the tile comprises a ceramic tile.

7. The platform of claim 1 further comprising a clear plate mounted to the platform forming a seal with the platform.

8. A probe platform for electrically probing semiconductor wafers comprising one or more ceramic tiles attached to the platform and configured symmetrically along an X-axis and an orthogonal Y-axis, wherein each of the ceramic tiles moveable in a direction parallel to the X-axis and in a direction parallel to the Y-axis, wherein each ceramic tile having a plurality of electrically conductive probes, each probe inserted into one of a plurality of holes and guides on the ceramic tiles for wafer testing.

9. A method for electrically probing a semiconductor wafer with a probe platform having one or more tiles configured in a matrix having an X-axis and an orthogonal Y-axis, the tiles being attached to multiple front and side transmission shafts for moving the tiles independently parallel to the X-axis and the Y-axis, the tiles each having an electrically conductive probe, the method comprising the steps of:

placing a semiconductor wafer under each of the tiles;

independently aligning each of the tiles above the semiconductor wafer;

inserting the electrically conductive probes in holes and slots of the tiles and electrically probing the semiconductor wafer.

10. The method of claim 9 wherein the step of independently aligning each of the tiles comprises the step of using the multiple font and side transmission shafts to independently align each of the tiles with the semiconductor wafer.

* * * * *